United States Patent [19]

Mermelstein

[11] Patent Number: 4,687,993

[45] Date of Patent: Aug. 18, 1987

[54] FIBER OPTIC MAGNETIC FIELD SENSING TRANSDUCER HAVING A RESONANT STRUCTURE

[75] Inventor: Marc D. Mermelstein, Chevy Chase, Md.

[73] Assignee: Geo-Centers, Inc., Newton Center, Mass.

[21] Appl. No.: 821,610

[22] Filed: Jan. 23, 1986

[51] Int. Cl.⁴ ............................................. G01R 33/032
[52] U.S. Cl. .................................... 324/244; 250/227; 350/376
[58] Field of Search ......................... 324/244, 260, 96; 250/227, 231 R; 350/375, 376

[56] References Cited

U.S. PATENT DOCUMENTS

| | | | |
|---|---|---|---|
| 4,348,587 | 9/1982 | Tangonan et al. | 324/96 XR |
| 4,442,350 | 4/1984 | Rashleigh | 324/96 XR |
| 4,528,481 | 7/1985 | Becker et al. | 324/244 XR |

FOREIGN PATENT DOCUMENTS 0165071  9/1983  Japan ................................... 324/244

OTHER PUBLICATIONS

Koo et al., Characteristics of Fiber-Optic Magnetic-Field Sensors Employing Metallic Glasses, Optics Letters vol. 7, No. 7, Jul. 1982, pp. 334-336.

*Primary Examiner*—Gerard R. Strecker
*Attorney, Agent, or Firm*—Louis Orenbuch; David Wolf

[57] ABSTRACT

A magnetic field sensing transducer which converts magnetic field intensity into a magnetostrictive strain and transfers that strain to an optical fiber employs a thin wall, hollow, cylindrical shell around which is wound a ribbon of an amorphous metallic magnetostrictive material. In another embodiment, the entire shell is formed by turns of the ribbon of magnetostrictive material. The optical fiber is coiled around the magnetostrictive cylinder formed by the wound ribbon and at both its ends, the optical fiber is affixed to the shell. The shell is covered at both its ends by caps and forms a thin wall resonator having three normal axisymmetric modes of vibration. The torsional vibratory mode is here of no interest because it does not appreciably couple to the optical fiber. Any one of the other two axisymmetric modes of vibration can be made dominant by selection of the appropriate length to radius ratio of the cylindrical shell. That property enables the transducer to be tuned to maximize its response to the applied dither field. The transducer is supported by a rod that extends centrally from the end caps. Strains induced by a magnetic field cause a modification in the phase of the light propagating through the optical fiber.

5 Claims, 4 Drawing Figures

FIBER OPTIC MAGNETIC FIELD SENSING TRANSDUCER HAVING A RESONANT STRUCTURE

U.S. GOVERNMENT RIGHTS IN THE INVENTION

This invention was made with government support by an employee of Geo-Centers, Inc., who was in the performance of work under Naval Research Laboratory Contract N00014-84-C-2215. The United States of America has certain rights in the invention arising out of that contract, including a nonexclusive, nontransferable, irrevocable, paid-up license to practive the invention or have it practiced for or on behalf of the United States throughout the world.

FIELD OF THE INVENTION

This invention relates in general to apparatus for the detection and measurement of magnetic fields. More particularly, the invention pertains to a novel transducer which converts the effects of magnetic fields upon magnetostrictive material to strains in photoelastic optical fibers.

BACKGROUND OF THE INVENTION

The invention utilizes the magnetostrictive properties of a metal alloy and the light modifying properties of a photoelastic optical fiber to provide a transducer for use in a fiber optic magnetometer. The principle of operation of the transducer is the transferral of strain from the magnetostrictive material to the optical fiber. The strain imposed upon the photoelastic optical fiber causes modifications in the phase of the light propagating along the optical fiber. The modification in the phase of the light propagating in the optical fiber may appear in two forms. In one of those forms, the phase modification is a phase shift caused by a change in the length of the optical path in the fiber. In the other form, the phase modification is a phase delay that appears as a difference in phase between orthogonal components of polarized light propagating in a stressed single mode optical fiber. In interferometry, phase shifts are usually detected with a two-fiber Mach-Zender interferometer whereas phase delays are usually detected with a single fiber interferometer often referred to as a polarimeter.

The crucial element in any fiber optical magnetometer is the transducer which converts magnetic field intensity into a strain and transfers that strain to the optical fiber. Because the sensitivity of the magnetometer is directly proportional to the length of the optical fiber to which the strain is applied, it is highly desirable to maximize the interaction length of the optical fiber.

In earlier transducers, the optical fiber was directly attached to a length of magnetostrictive ribbon. Because ribbon lengths were limited to 10 to 50 cm, the fiber-magnetostrictive ribbon interaction length of the earlier transducers was typically increased to about two meters by folding the fiber back and forth along the ribbon. The resonance structure (and therefore the frequency response) of such earlier transducers is ill defined and is dependent upon parameters, such as boundary conditions, that are difficult to control. Moreover, because the harmonic response of the ribbon can be large, the earlier transducers tended to introduce an unwanted signal at $2\omega$ in the magnetometer's output.

OBJECTS OF THE INVENTION

The principal object of the invention is to provide a highly sensitive transducer that conduces to the detection and measurement of magnetic fields.

Another major object of the invention is to increase the sensitivity of a magnetic field sensing transducer of the optical fiber type by causing long lengths of the optical fibers (i.e. lengths in the order of 100 meters) to interact with a magnetostrictive element in a compact structure.

Yet another major object of the invention is to provide a magnetic field sensing transducer of the optical fiber type which facilitates signal processing by having a well defined and controllable frequency response that includes harmonic supression.

A further major object of the invention is to provide a magnetic field sensing transducer of the optical fiber type for use in interferometry which transducer allows the application of strains to the optical fiber in either the axial or lateral direction or in both directions, depending upon the particular kind of interferometer in which the transducer is used.

THE DRAWINGS

DETAILED DESCRIPTION OF EMBODIMENTS OF THE INVENTION

Figure 1:
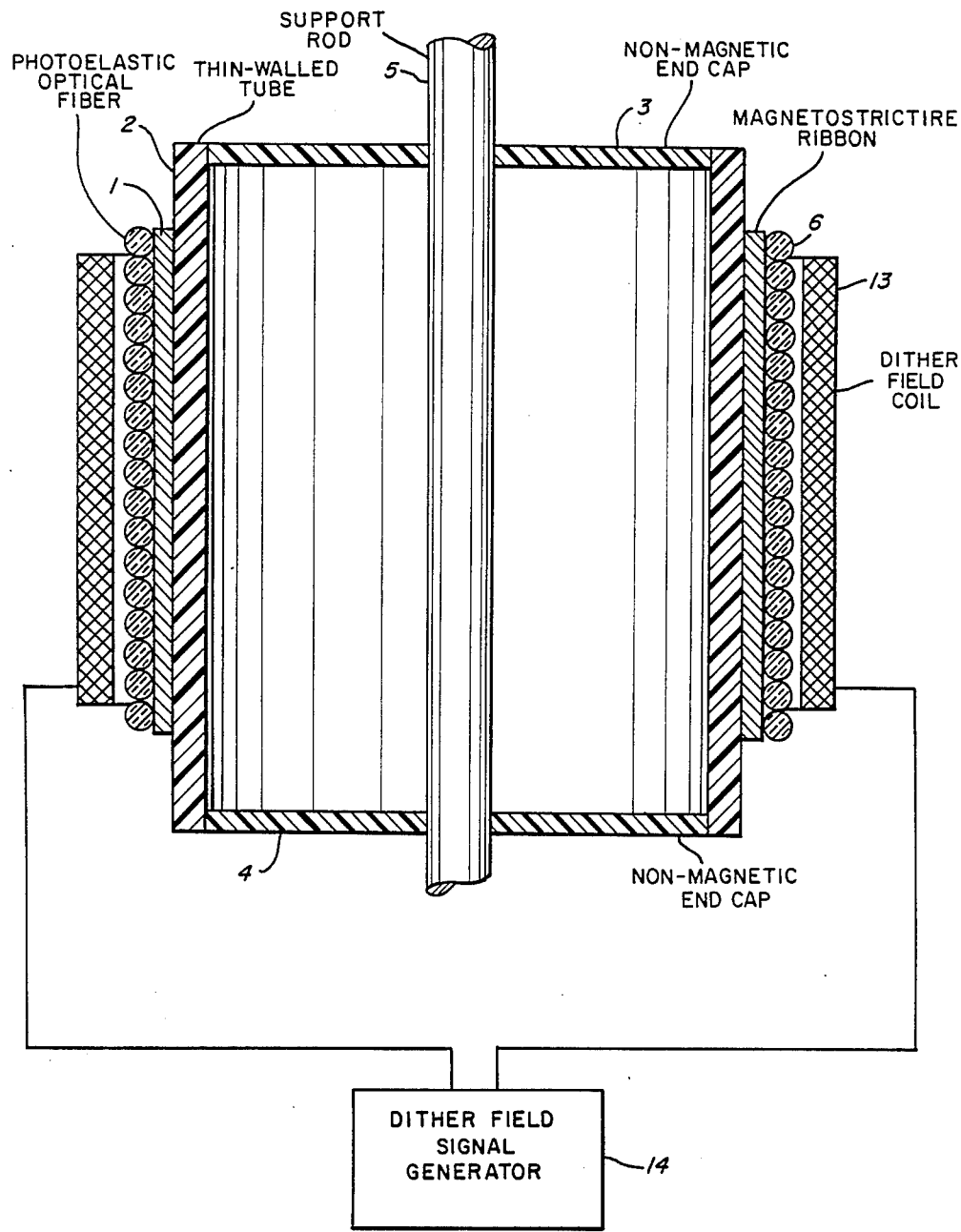
FIG. 1 is a schematic view, in cross-section, of the preferred embodiment of the invention.

Referring now to FIG. 1 of the drawings, there is shown the scheme of the preferred embodiment of the invention. In that embodiment, two turns of a flexible ribbon 1 of a magnetostrictive material are wrapped around a hollow cylindrical thin-walled tube 2. The ribbon is comprised of an amorphous metallic magnetostrictive material and is made in ribbon form by Metglas Products of Parsippany, N.J. (Metglas Products is a division of Allied Corporation). The hollow cylindrical tube 2 is of an acrylic material that was chosen for its relatively low Young's modulus to allow large amplitude strains to develop for a given amount of available mechanical energy. In an embodiment that was actually constructed, an acrylic tube was employed having a uniform wall thickness. At each end, the thin-walled tube was capped by one of the discs 3 and 4 which were of a non-magnetic material. Extending centrally through the end caps 3, 4 is an aluminum rod 5 by which the tube and its end caps are supported. A long length of a photoelastic optical fiber 6 is wound under slight tension around the magnetostrictive ribbon 1 in a single helical row of side by side, abutting turns. (For the purpose of illustration, the ribbon and the optical fiber have been exaggerated in FIG. 1.) At both its ends, the optical fiber is secured by an adhesive to the ribbon 1.

The composite structure depicted in FIG. 1 may be viewed as a thin-shell resonator with shear diaphragm end-cap boundary conditions. That structure has three normal modes of vibration, one being an uncoupled azimuthal mode and the other two being hybrid modes having mixtures of radial and axial motion. In operation the magnetostrictive element is subjected to a total magnetic field H oriented along the longitudinal axis of the shell. The total magnetic field consists of a constant or slowly varying signal field $H_o$ and a sinusoidal dither field $h(\omega)$ oscillating at a frequency $\omega$. Strains are induced in the magnetostrictive ribbon in response to the presence of the magnetic fields. That strain is a non-linear function of the total magnetic field strength and, for small field strengths, is approximated by $e = \alpha H^2$, where $\alpha$ is a constant intrinsic to the magnetostrictive ribbon. The linear response of the ribbon to the total field is $e(\omega) = 2\alpha H_o h(\omega)$. The mechanical energy of the vibrating ribbon tends to excite the resonant mode of the composite transducer. If the dither frequency $\omega$ is tuned to a frequency $\omega_o$ at which the transducer is resonant, then the transducer will respond with large amplitude oscillations in its hybrid normal modes of vibration.

Figure 2:
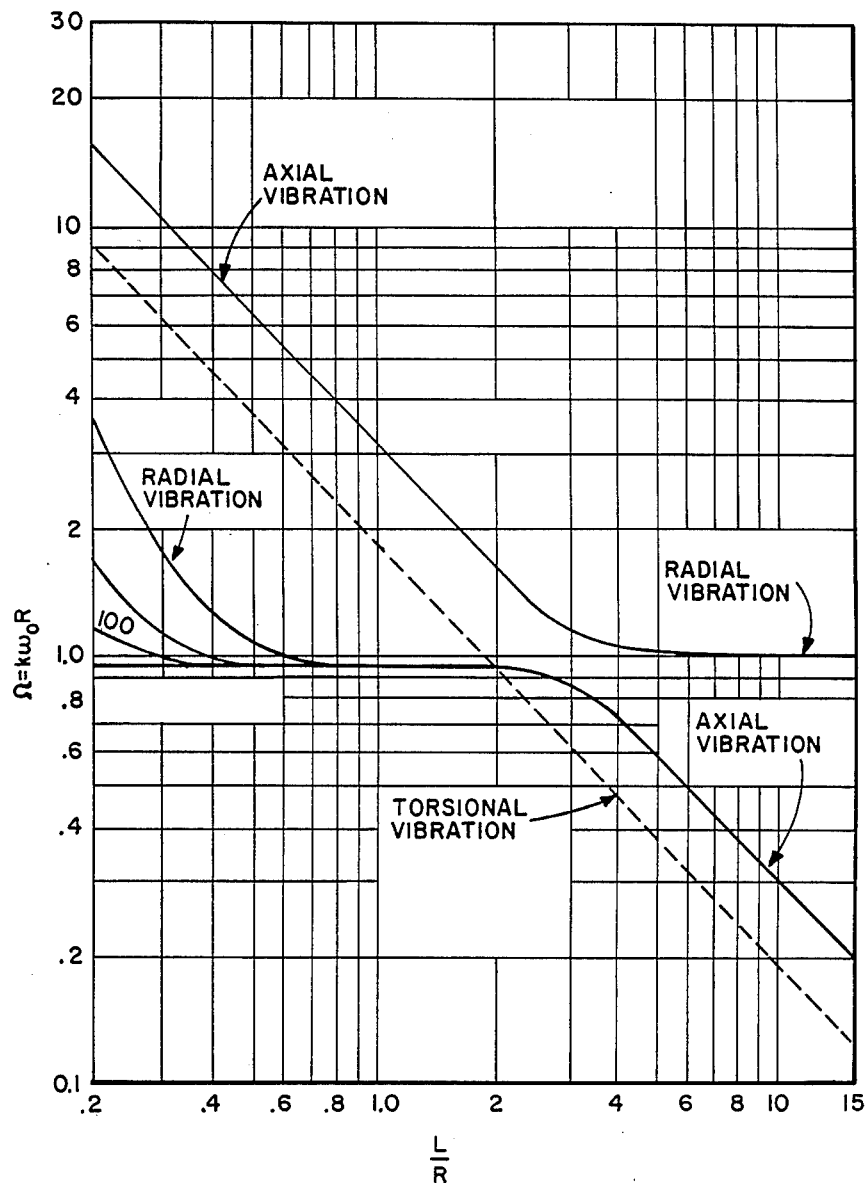
FIG. 2 is a graph showing the three normal axisymmetric vibratory modes of the thin wall cylinder.

In the FIG. 2 graph, normalized resonant frequencies for a thin shell resonator are plotted as a function of the length to radius ratio for L/R axisymmetric motion. The normalized resonant frequency $\Omega = k\omega_o R$, where k is a constant of the amorphous metallic magnetostrictive material, $\omega_o$ is the radial frequency $2\pi f$, and R is the radius of the shell. Axisymmetric modes are of primary importance here because those modes maximize coupling of the strain to the optical fiber over the entire fiber length. It can be appreciated that by proper selection of the resonator geometry (specifically the length to radius ratio) the resonator can be made to favor (e.g. in the lower resonance branch) either a mostly radial mode of vibration or a mostly axial mode of vibration. The amplitude of the transducer strain will be $e(\omega_o) = -2\tilde{\alpha} H_o h(\omega_o)$, where $\tilde{\alpha}$ is no longer an intrinsic property of the magnetostrictive material but instead is dependent upon the overall behavior of the composite structure. From the foregoing equation, it can be observed that the amplitude $e(\omega_o)$ of the transducer strain is proportional to the DC magnetic field intensity $H_o$. Consequently measurement of the transducer strain enables the intensity of the constant or slowly varying magnetic field to be ascertained.

Mach-Zender interferometers require an axial strain in the wound optical fiber in order to produce the requisite phase shift. Hence, to obtain a mostly radial vibratory mode the length to radius ratio L/R may for example be selected so that L/R<0.5 for the lower resonance and L/R>5.0 for the upper resonance. Polarimetric sensors which utilize a single mode optical fiber having high birefringence may also rely upon the imposition of axial strains on the fiber and could employ a similar selection. However, for those polarimetric sensors which rely upon the imposition of lateral force on the fiber to induce birefringence and consequently require a large axial strain component in the thin shell resonator to impose lateral stress on the fiber, the L/R ratio would be chosen, for example, so that L/R>5.0 for the lower resonance and L/R<0.5 for the upper resonance.

A magnetostrictive transducer like that depicted in FIG. 1 was actually constructed and employed in a fiber optic DC magnetometer. That transducer employed a hollow cylindrical acrylic tube having a wall thickness t=0.05", an inner radius R=1.0" and a length L=2.5". Two turns of an unannealed magnetostrictive amorphous metal ribbon (made by Metglas Products of Parsippany, N.J. and designated as its "2605S2" material) having a thickness ~30 μm was wrapped around the acrylic tube. Twenty meters of a high birefringence "single mode" optical fiber was subsequently wound, under slight tensions, in a helix around the magnetostrictive ribbon, with the turns being disposed in a single row and being in abutting relation. At each end, the optical fiber was fixed by an epoxy adhesive to the magnetostrictive ribbon.

Figure 3:
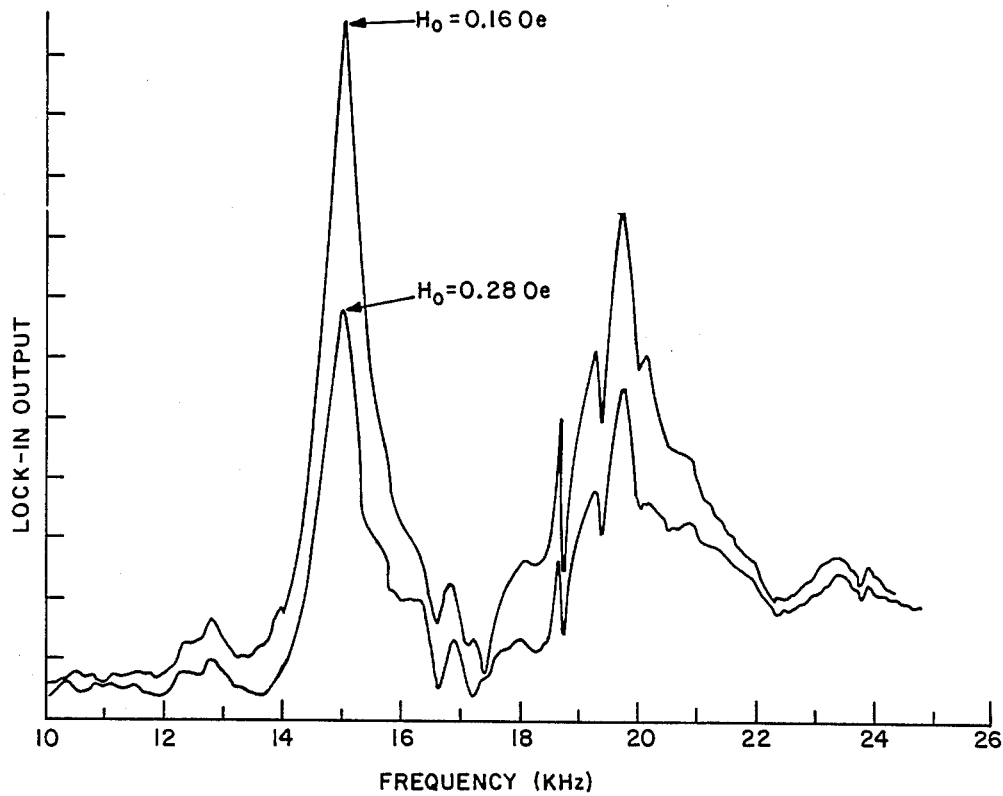
FIG. 3 is plot of results obtained from an actual transducer that was constructed in the manner shown in FIG. 1 and shows the amplitude response of the transducer to a sweep of the dither frequency.

In the operation of the magnetometer, the transducer was subjected to an unvarying magnetic signal field and an AC dither field, in the manner previously discussed herein. As depicted in FIG. 1, the alternating magnetic dither field was established by a coil 13 of wire position around and concentric with the shell of the resonant structure. The coil 13 was spaced from the resonant structure by a sufficient gap to insure that the resonance of that structure was not damped or changed by contact with the coil 13. The coil 13 was electrically energized by a dither field signal generator 14 which provided alternating current to the coil. The current flow in the coil caused an alternating magnetic dither field to be established within the domain of the unvarying magnetic signal field. The field-induced radial strain in the transducer strained the fiber in the axial direction. This axial strain was measured by observing the birefringence fluctuations in the light transmitted through the optical fiber with a polarimetric interferometer. The frequency response of the transducer was obtained by sweeping the frequency of the AC dither field and monitoring the strain amplitude. FIG. 3 is a plot of that frequency response in which frequency is plotted along the abscissa and strain amplitude is plotted along the ordinate. As can be seen in the FIG. 3 plot, a major resonance was observed at 15 kHz. An estimate of the resonance frequency, based upon theory, was made from the dispersion relations appearing in the FIG. 2 graph, the length to radius ratio, and averaged values for the material parameters. The resonance was estimated to be 16.8 kHz. That estimate is in reasonable agreement with the actual resonant frequency observed in the experiment. Theoretical calculations predicted a second resonance at approximately 24.3 kHz. That predicted resonance is believed to correspond with the second most prominent peak appearing in the FIG. 3 plot at 20 kHz.

Magnetostriction, as is well-known, is a non-linear phenomenon. Consequently, for low intensity magnetic fields, there is a frequency component in the induced strain that occurs at twice the dither frequency: $e(2\omega_o) = \frac{1}{2}\tilde{\alpha} h_o^2 \cos(2\omega_o t)$. Ignoring the torsional mode because it does not appreciably couple to the optical fiber, the dispersion relations permit only two axisymmetric resonant modes. The harmonic of the dither frequency does not correspond to a resonance and hence it tends to be suppressed. That harmonic suppression avoids complications in signal processing that arise from the presence of a strong harmonic.

Figure 4:
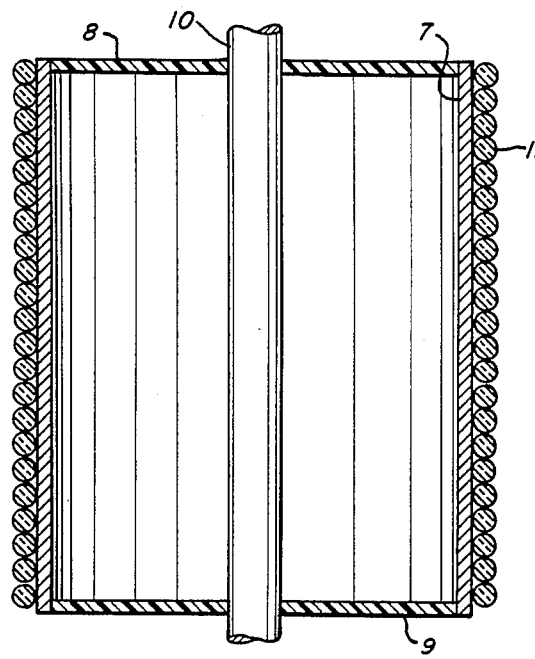
FIG. 4 is a schematic view, in cross-section, of an embodiment of the invention in which the thin wall cylindrical shell is formed by turns of the magnetostrictive ribbon.

Referring now to FIG. 4, an embodiment of the invention is shown in which the acrylic tube is eliminated. The thin-wall shell 7, in the FIG. 4 embodiment, is formed of a large number of turns of the magnetostrictive amorphous metal ribbon with the turns being held together by an interposed adhesive to form a more rigid structure. At each end, the hollow cylindrical shell is capped by a disk 8 or 9 of non-magnetic material. Extending centrally through the end caps 8 and 9 is a support rod 10 which is also made of a non-magnetic material, such as aluminum. As in the FIG. 1 embodiment, a long optical fiber 11 is coiled in a helix around the magnetostrictive element and that optical fiber is secured at both its ends to the magnetostrictive shell 7 by an adhesive, such as an epoxy glue.

Rather than employ a bare optical fiber, it is preferred to employ an optical fiber having a protective jacket on it. Jacketed optical fibers (such as the Andrew D fiber and the York Technologies Bow-Tie fiber) are commercially available. The sensitivity of the optical fiber is modified by the jacket of the fiber. For a discussion of fiber sensitivity modification by a jacket see the book titled "Single-Mode Fiber Optics" by L. B. Jeunhomme, pp. 242–244, Marcel Dekker, Inc., 1983. Where the fiber is to be made responsive primarily to longitudinal strain, a fiber having a thin, hard jacket is preferred. The type of jacket and its composition can be chosen to modify the fiber's sensitivity in the desired manner while retaining protection for the fiber.

Inasmuch as the invention can be embodied in various forms, it is not intended that the scope of the invention be limited only to the embodiments here described. It is intended rather, that the scope of the invention be construed in accordance with the appended claims, having due regard for obvious changes that do not depart from the essentials of the invention.

I claim:

1. A transducer for sensing a constant or slowly varying magnetic signal field, comprising
   (A) a resonant structure having
      (a) a thin wall hollow cylindrical shell,
      (b) end caps secured to and closing off each end of the shell whereby a hollow chamber is provided,
      (c) a magnetostrictive ribbon wrapped around the cylindrical wall of the shell and responsive to the component of the magnetic signal field that is along the longitudinal axis of the cylindrical shell,
      (d) a birefringent optical fiber coiled around the magnetostrictive ribbon,
      (e) means affixing each end of the optical fiber coil to the magnetostrictive ribbon, and
   (B) means proximate said resonant structure for establishing an alternating magnetic dither field within the domain of said magnetic signal field, said dither field having a frequency at which the resonant structure resonates.

2. The transducer according to claim 1, wherein the resonant structure further includes
   (f) support means extending outwardly from the end caps.

3. A transducer for sensing a constant or slowly varying magnetic signal field, comprising
   (A) a resonant structure having
      (a) a thin wall, hollow cylindrical shell of magnetostrictive material, said magnetostrictive shell being responsive to the component of the slowly varying magnetic signal field that is along the longitudinal axis of the cylindrical shell
      (b) end caps secured to and closing off each end of the cylindrical shell whereby a hollow chamber is provided,
      (c) a birefringent optical fiber coiled around the exterior cylindrical wall of the shell,
      (d) means affixing each end of the optical fiber coil to the magnetostrictive shell, and
   (B) means proximate said resonant structure for establishing an alternating magnetic dither field within the domain of said magnetic signal field, said dither field having a frequency at which the resonant structure resonates.

4. The transducer according to claim 3, wherein the resonant structure further includes
   (e) support means extending outwardly from the end caps.

5. The transducer according to claim 3, wherein the thin wall, hollow, cylindrical shell is comprised of a plurality of turns of a ribbon of an amorphous metallic magnetostrictive material.

* * * * *